United States Patent
Kang

(10) Patent No.: US 8,467,223 B2
(45) Date of Patent: Jun. 18, 2013

(54) NON-VOLATILE MEMORY DEVICE AND SENSING METHOD FOR FORMING THE SAME

(75) Inventor: Hee Bok Kang, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 137 days.

(21) Appl. No.: 13/204,557

(22) Filed: Aug. 5, 2011

(65) Prior Publication Data

US 2012/0033478 A1  Feb. 9, 2012

(30) Foreign Application Priority Data

Aug. 5, 2010  (KR) .................. 10-2010-0075722

(51) Int. Cl.
 *G11C 11/22* (2006.01)
(52) U.S. Cl.
 USPC .............................. 365/145; 365/65; 365/117
(58) Field of Classification Search
 USPC ........................................ 365/145, 117, 65
 See application file for complete search history.

(56) References Cited

U.S. PATENT DOCUMENTS

| | | | | |
|---|---|---|---|---|
| 5,838,041 A | * | 11/1998 | Sakagami et al. | 257/324 |
| 5,877,977 A | * | 3/1999 | Essaian | 365/145 |
| 6,288,942 B1 | * | 9/2001 | Iizuka et al. | 365/185.17 |
| 6,342,712 B1 | * | 1/2002 | Miki et al. | 257/295 |

FOREIGN PATENT DOCUMENTS

| KR | 1020060117792 A | 11/2006 |
|---|---|---|
| KR | 100732802 B1 | 6/2007 |

* cited by examiner

*Primary Examiner* — Pho M Luu

(57) ABSTRACT

A non-volatile memory device and a method for forming the same are disclosed, which relate to a ferroelectric memory device having non-volatile characteristics. The non-volatile memory device includes a control gate configured to receive a read voltage, an insulation film formed over the control gate, a metal layer formed over the insulation film, configured to include a channel region, and a drain region and source region at both ends of the channel region, a ferroelectric layer formed over the channel region of the metal layer, and a program and read gate formed over the ferroelectric layer. A write operation of data corresponding to a resistance state of the channel region is performed by changing polarity of the ferroelectric layer in response to a voltage applied to the program and read gate, the drain and source regions, and the control gate. A read operation of data is performed by sensing a current value changing with a polarity state of the ferroelectric layer on the condition that the read voltage is input to the control gate and a sensing bias voltage is input to one of the drain region and the source region.

36 Claims, 11 Drawing Sheets

<HIGH-RESISTANCE>

<HIGH-RESISTANCE>

NON-VOLATILE MEMORY DEVICE AND SENSING METHOD FOR FORMING THE SAME

CROSS-REFERENCE TO RELATED APPLICATION

The priority of Korean patent application No. 10-2010-0075722 filed on Aug. 5, 2010, the disclosure of which is hereby incorporated in its entirety by reference, is claimed.

BACKGROUND OF THE INVENTION

Embodiments of the present invention relate to a non-volatile memory device and a method for forming the same, and more specifically, to a ferroelectric memory device having non-volatile characteristics.

Generally, a non-volatile ferroelectric memory (e.g., a Ferroelectric Random Access Memory (FeRAM)) has a data processing speed similar to that of a Dynamic Random Access Memory (DRAM). A non-volatile ferroelectric memory also preserves data even when power is turned off. Because of these properties, many developers are conducting intensive research into FeRAM as a next generation memory device.

The above-mentioned FeRAM has a very similar structure to that of DRAM, and uses a ferroelectric capacitor as a memory device. Ferroelectric substances have high residual polarization characteristics, such that data is not deleted although an electric field is removed.

A conventional 1-Transistor 1-Capacitor (1T1C)-type unit cell includes one switching element, which performs a switching operation according to a word line state and couples a bit line to a non-volatile ferroelectric capacitor, and one non-volatile ferroelectric capacitor coupled between one end of the switching element and a plate line.

The switching element of the conventional non-volatile ferroelectric memory device is generally formed of an N-type Metal Oxide Semiconductor (NMOS) transistor switched by a gate control signal.

FIG. 1 is a cross-sectional view illustrating a cell used in a conventional semiconductor memory device.

Referring to FIG. 1 a conventional semiconductor memory device includes an one-transistor Field Effect Transistor (1-T FET)-type ferroelectric memory cell.

A memory cell of the related art includes a P-type channel region formed over a P-type semiconductor substrate 1, an N-type drain region 2 and an N-type source region 3. A ferroelectric layer 4 is formed over a channel region, and a word line 5 is formed over the ferroelectric layer 4.

A buffer insulation layer 6 may be formed between the channel region and the ferroelectric layer 4 for fabrication stabilization. That is, the buffer insulation layer 6 may be formed to overcome problems that result from a difference in an electrical property between the channel region and the ferroelectric layer 4.

The above-mentioned semiconductor memory device is configured to read/write data using memory-cell channel resistance characteristics that change according to the polarization state of the ferroelectric layer 4.

In other words, if the polarity of the ferroelectric layer 4 induces a positive (+) charge in a channel, the memory cell is at a high-resistance channel state so that the memory cell is turned off. In contrast, if the polarity of the ferroelectric layer 4 induces a negative (−) charge in the channel, the memory cell is at a low-resistance channel state so that the memory cell is turned on. In this way, the conventional ferroelectric memory cell selects the polarization type of the ferroelectric layer 4 and writes or reads data in a cell, so that it can serve as a non-volatile memory cell.

However, while the memory cell of the conventional 1T-FET-type ferroelectric memory device has non-volatile characteristics, cell data deteriorates with a lapse of time so that the data retention lifetime is limited. As a result, it is difficult to keep data using non-volatile cell storage characteristics for a long period of time.

In addition, the conventional ferroelectric memory device controls a current using a lower semiconductor substrate. The lower P-type substrate 1 may be formed of silicon (Si), germanium (Ge), or the like. A metal-based ferroelectric layer 4 and the semiconductor substrate have different electrical characteristics. Thus, an interface between the ferroelectric layers 4 and the semiconductor substrate may deteriorate rapidly with a lapse of time, so that it is hard to guarantee stable operation.

BRIEF SUMMARY OF THE INVENTION

Various embodiments of the present invention are directed to providing a non-volatile memory device and a method for forming the same that substantially obviate one or more problems due to limitations and disadvantages of the related art.

First, an embodiment of the present invention relates to a non-volatile memory device and a method for forming the same, which can implement a ferroelectric memory device using a metal oxide channel layer that includes the same material as in the ferroelectric layer, resulting in a simplified fabrication process.

Second, an embodiment of the present invention relates to a non-volatile memory device and a method for forming the same, which can adjust a metal electrode, which includes the same material as in the ferroelectric layer, to be thin, resulting in reduction of a cell size.

Third, an embodiment of the present invention relates to a non-volatile memory device and a method for forming the same, which can prevent memory cell characteristics from deteriorating using the same-based metal layer as in the ferroelectric layer, so that the operation stability is guaranteed and data retention characteristics are improved.

In accordance with one embodiment of the present invention, a non-volatile memory device includes a control gate configured to receive a read voltage, an insulation film formed over the control gate, a metal layer formed over the insulation film, the metal layer configured to include a channel region, and a drain region and a source region formed at first and second ends of the channel region, a ferroelectric layer formed over the channel region of the metal layer, and a program and read gate formed over the ferroelectric layer. A write operation of data corresponding to a resistance state of the channel region is performed by changing polarity of the ferroelectric layer in response to a voltage applied to the program and read gate, the drain and source regions, and the control gate. A read operation of data is performed by sensing a current value changing with a polarity state of the ferroelectric layer if the read voltage is input to the control gate and a sensing bias voltage is input to any of the drain region and the source region.

In accordance with another embodiment of the present invention, a non-volatile memory device includes a first program and read gate configured to receive a voltage for programming or reading data; a first ferroelectric layer formed over the first program and read gate; a metal layer formed over the first ferroelectric layer, the metal layer configured to include a channel region, and a drain region and source region formed at first and second ends of the channel region; a second ferroelectric layer formed over the channel region of the metal layer; and a second program and read gate formed over the second ferroelectric layer. A write operation of data corresponding to a resistance state of the channel region is performed by changing polarities of the first and second ferroelectric layers in response to a voltage applied to the first program and read gate, the second program and read gate, the drain region, and the source region. A read operation of data is performed by sensing a current value changing with polarity states of the first and second ferroelectric layers if a sensing bias voltage is input to any of the drain region and the source region.

In accordance with still another embodiment of the present invention, a method for forming a non-volatile memory device includes forming a transistor over a substrate; forming a control gate over the substrate; forming an insulation film over the control gate; forming a metal layer over the insulation film in such a manner that the metal layer is coupled to a source region of the transistor; forming a ferroelectric layer over the metal layer; and forming a gate configured to perform a program and read operation over the ferroelectric layer.

In accordance with another embodiment of the present invention, a non-volatile memory device includes a transistor including a first source region and a first drain region, and a metal channel resistor (MCR) coupled to the first source region of the transistor, wherein the MCR includes: a metal channel layer; a ferroelectric layer coupled to a first side of the metal channel layer; a program and read gate coupled to the ferroelectric layer; and a control gate coupled to a second side of the metal channel layer.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 2:
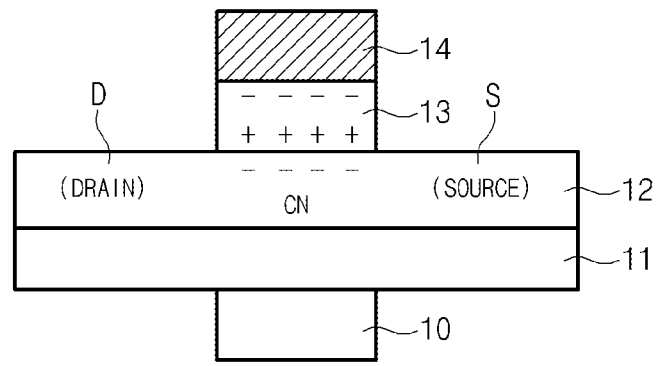
FIG. 2 is a cross-sectional view illustrating a unit cell of a non-volatile memory device according to an embodiment of the present invention.

FIG. 2 is a cross-sectional view illustrating a unit cell of a non-volatile memory device according to an embodiment of the present invention.

Referring to FIG. 2, a control gate 10 is formed at the bottom layer, and an insulation film 11 is formed over a control gate 10. A metal layer 12 is formed over the insulation film 11, and a ferroelectric layer 13 is formed over the metal layer 12. In an embodiment, the insulation film 11 may be formed to prevent an electrical short-circuit between the control gate 10 and the metal layer 12, which may be formed of the same metal. In addition, a program and read gate 14 are formed over the ferroelectric layer 13.

A support substrate for supporting the control gate 10 may be formed below the control gate. In an embodiment, the support substrate for supporting the control gate 10 may be formed of any of silicon, glass, wood, plastic, etc., as long as it is capable of being used as a support.

The upper program and read gate 14 may correspond to a top metal electric device, and the lower metal layer 12 may correspond to a bottom metal electrode.

The program and read gate 14, the ferroelectric layer 13, and the control gate are formed parallel to each other. In addition, the program and read gate 14, the ferroelectric layer 13, and the control gate 10 are formed to cross the insulation film 11 and the metal layer 12.

The metal layer 12 formed between the program and read gate 14 and the control gate 10 may also be formed of a metal oxide material.

A drain region D and a source region S are formed at either end of a channel region CN of the metal layer 12. Although FIG. 2 shows both end regions of the channel region CN are used to form the drain region D and the source region S, this is merely an example. The drain region D and the source region Scan be arranged anywhere in the metal layer 12 and may be formed in any shape.

Figure 1:
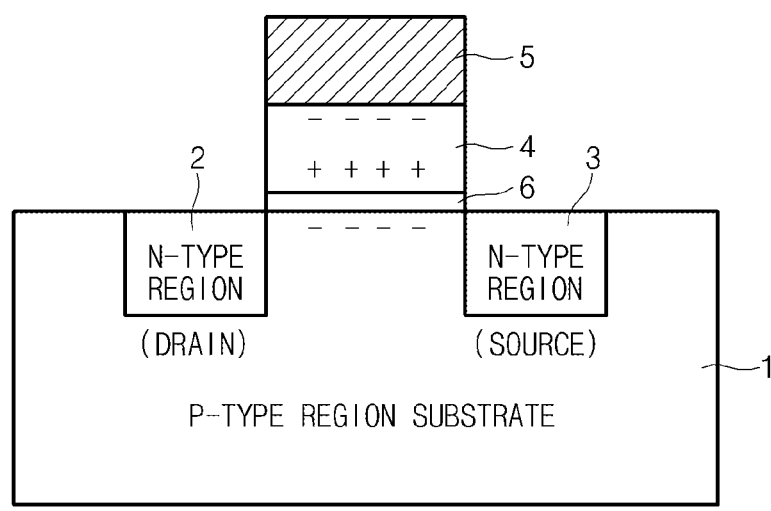
FIG. 1 is a cross-sectional view illustrating a conventional non-volatile memory device.

That is, according to the conventional structure shown in FIG. 1, cell operation is carried out on the basis of a voltage (Vgs) between a source and a gate. Therefore, a channel region, a source region, and a drain region must be formed of semiconductor material, and the conventional structure shown in FIG. 1 should have a source region 3 and a drain region 2 that are separate structures from the channel region. In accordance with the conventional unit cell, a channel layer is formed of a semiconductor material so that charges are moved to the channel region because of semiconductor characteristics.

However, the drain region D and the source region S, according to an embodiment of the present invention, perform different functions in the metal layer 12. Although the separate drain region and the separate source region are interchangeable to each other, cell operation is made through the channel region CN of the metal layer 12.

In an embodiment, as shown in FIG. 2, although widths of both ends of the metal layer 12 are larger than that of the ferroelectric layer 13 and the plate line 14, the scope and spirit of the embodiment is not limited thereto. If necessary, a horizontal width of the metal layer 12 may be identical to that of the ferroelectric layer 13 or the plate line 14. As long as both nodes of the channel region CN are coupled to a bit line and a sensing line, cell operation may be achieved.

For convenience of description and better understanding of the present invention, it is assumed that the width of the metal layer 12 is larger than that of the ferroelectric layer 13 and the plate line 14 and that the sensing line is coupled to the metal layer 12.

The channel region CN of the metal layer 12 may be used as a variable resistor. In addition, if the metal layer 12 is formed to have a thin electrode, the amount of current flowing in the metal layer 12 may be changed according to the electrode thickness of the metal layer 12.

The electrode thickness of the metal layer 12 may be set to such a thickness that it is capable of driving charges of the ferroelectric layer 13. In accordance with an embodiment of the present invention, a thickness of the metal layer 12 may have the same thickness as that of the gate region. For example, the metal layer 12 may be formed to a thickness of 1-5 nanometers (50 Å) or 1~10 nanometers (100 Å).

In the metal layer 12, the drain region D, the source region S, and the channel region CN may be formed of the same metal material or different metal materials.

In an embodiment, the metal layer 12 may be formed of platinum (Pt), iridium (Ir), or ruthenium (Ru), etc. If the metal layer 12 is formed of a metal oxide material, the metal layer 12 may include an oxide iridium (IrO2), an oxide strontium ruthenium (SrRuO3), etc. The insulation film 11 may include a silicon oxide film (SiO2), and a silicon oxide nitride film (SiON), etc. The control gate may be formed of polysilicon or metal material.

In addition, the drain region D of the metal layer 12 is coupled to the bit line BL, the source region S is coupled to the sensing line, and the program and read gate 14 may be coupled to the word line (WL).

If the unit cell shown in FIG. 2 is coupled to a neighboring cell, the ferroelectric layer 13 and the plate line 14 are insulated from the neighboring cell, and the channel region CN of the metal layer 12 is coupled to the neighboring cell in a line form. However, the unit cells formed on the same row line do not share the plate line 14 with the neighboring cell, so that data can be independently stored in each unit cell.

Figure 3:
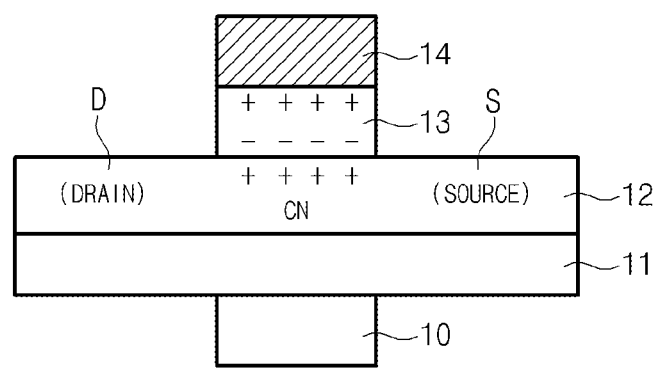
FIGS. 3 and 4 illustrate operation principles of the non-volatile memory device shown in FIG. 2.

FIG. 3 shows operation principles of a non-volatile memory device according to an embodiment of the present invention when data '1' is stored in a unit cell of the non-volatile memory device.

Data can be read or written using channel resistance, which changes in response to a polarization state of the ferroelectric layer 13.

In a program mode, a read mode, and a standby mode, the following voltage levels, as shown in Table 1, may be applied to the program and read gate 14, the metal layer 12, and the control gate 10, respectively.

TABLE 1

| Operation Mode | Program and Read gate (14) | Metal layer (12) | Control Gate (10) |
|---|---|---|---|
| Program Mode | High (data '0')/ Low (data '1') | High (data '1')/ Low (data '0') | Low |
| Read Mode | Low | Sensing bias voltage | Read voltage |
| Standby Mode | Low | Low | Low |

As shown in Table 1, in the write operation mode of data '1', a low voltage is input to the program and read gate 14, and a high voltage is input to each of the drain region D and the source region S of the metal layer 12. A low voltage is input to the control gate 10.

The high voltage may be indicative of a positive (+) voltage, and may be set to a power-supply voltage (VDD) level equal to or higher than a threshold voltage at which polarization characteristics of the ferroelectric material are changed. In contrast, the low voltage may be a ground voltage level that is lower than the high voltage.

The program and read gate 14 and the control gate 10 are coupled to the word line so as to select an address using the same word line decoder. In addition, pulses applied to the program and read gate 14 and the control gate 10 may be provided from the same or different voltage generators.

A positive (+) charge is applied to the channel region CN according to the polarity of the ferroelectric layer 13 so that electrons of the channel region CN may enter a depletion state. Therefore, the channel region CN of the metal layer 12 may enter a high-resistance state so that the channel region CN is turned off. The high-resistance state of the channel region CN is defined as a program state of data '1'.

Figure 4:
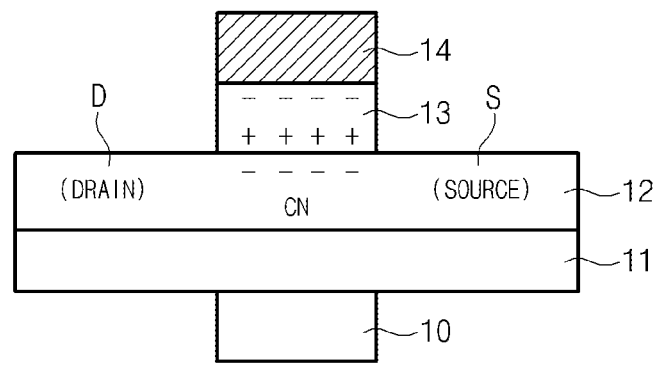

FIG. 4 shows operation principles of a non-volatile memory device according to an embodiment of the present invention when data '0' is stored in a unit cell of the non-volatile memory device.

As shown in Table 1, in the write operation mode of data '0', a high voltage is input to the program and read gate 14, and a low voltage is input to the drain region D and the source region S of the metal layer 12. A low voltage is input to the control gate 10.

A negative (−) charge is applied to the channel region CN according to the polarity of the ferroelectric layer 13 so that electrons are accumulated in the channel region CN. Therefore, the channel region CN of the metal layer 12 may enter a low-resistance state so that the channel region CN is turned on. The low-resistance state of the channel region CN is defined as a program state of data '0'.

In this case, a non-volatile memory device according to an embodiment of the present invention employs the ferroelectric layer 13 so that the metal layer 12 enters a depletion state and so that electrons accumulate in the metal layer 12, resulting in increased sensing efficiency of the channel region CN.

Figure 5:
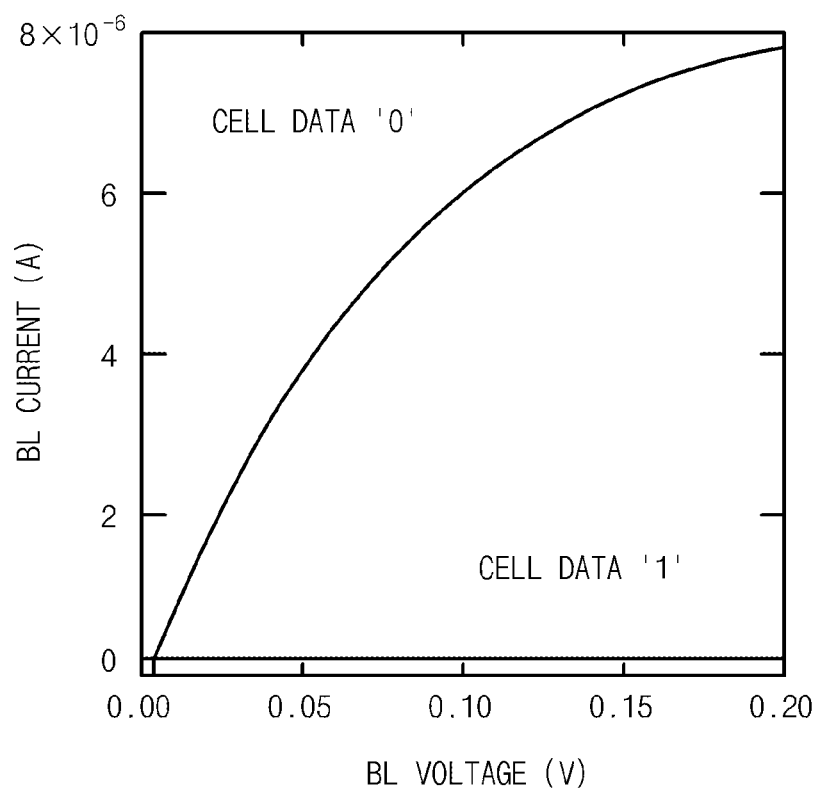
FIG. 5 illustrates a bit line current in a read mode of a non-volatile memory device according to an embodiment of the present invention.

FIG. 5 is a graph illustrating a bit line (BL) current state in a read mode of the non-volatile memory device according to an embodiment of the present invention.

In the read operation mode, a voltage value obtained when the channel region CN of the metal layer 12 is turned on or off may be set to a read voltage. A read voltage is lower than a threshold value at which polarization characteristics of the ferroelectric layer changes. A read voltage may be a predetermined voltage applied to the control gate 10 when the channel region CN is turned on or off. That is, a maximum or a minimum current value of the drain region D and the source region S within the turn ON/OFF region of the channel region CN may be set to a read voltage value.

If a read voltage is input to the control gate 10, a bit line (BL) current may be a maximum or a minimum current value in response to a voltage transmitted from the drain region D to the source region S. In this case, the source region S coupled to the sensing line may preserve the ground voltage level.

If the channel region CN is turned on, the read voltage may enter a low-resistance state, so that the largest amount of BL current flows in the channel region CN. If the channel region CN is turned off, the read voltage may enter a high-resistance state, so that the smallest amount of BL current flows in the channel region CN.

In addition, if a bit line (BL) voltage is changed under the same read voltage, different BL current values are obtained according to the value of cell data stored in the memory cell.

In other words, provided that data '0' is stored in the memory cell and the bit line (BL) voltage is increased, a large amount of bit line (BL) currents may flow in the memory cell. In contrast, if data '1' is stored in the memory cell and the BL voltage is increased, the BL current remains unchanged and a small amount of BL current flows in the memory cell.

The data read operation in the non-volatile memory device according to an embodiment of the present invention will hereinafter be described with reference to the Tables and the accompanying drawings.

In the read operation mode of data, a low voltage is input to the program and read gate 14, as shown in Table 1. A sensing bias voltage is input to the bit line BL coupled to the drain region D, and a ground voltage is input to the sensing line coupled to the source region S. The sensing bias voltage is lower than the read voltage. In an embodiment, the sensing bias voltage may be provided from a write driver (not shown) as necessary.

In this case, when data is read in the memory cell, the write driver generates a drive voltage in response to write data, and provides the generated drive voltage to the bit line (BL) or the sensing line. The write driver is coupled to either bit line BL or the sensing line.

Under this condition, a voltage level of the control gate 10 transitions from the ground voltage level to a read voltage level. Thus, a current flowing in the metal layer 12 is changed according to the polarity of the ferroelectric layer 13, so that data can be read through the sense amplifier (sense-amp).

That is, if the channel region CN of the metal layer 12 is positively charged, when a sensing bias voltage is input to the drain region D, a ground voltage is input to the source region S, and a read voltage is input to the control gate 10, the metal layer 12 enters a high-resistive state, thus maintaining a turn-OFF state of the channel region CN of the metal layer 12.

In an embodiment, if there is a voltage difference between the drain region D and the source region S, the channel region CN is turned off so that a small amount of current flows between the drain region D and the source region S. Therefore, data '1' stored in the memory cell can be read out in the read operation mode.

On the other hand, if the channel region CN of the metal layer 12 is negatively charged, when a sensing bias voltage is input to the drain region D, and a ground voltage is input to the source region S, the metal layer 12 is laid at a low-resistance state, thus maintaining a turn-ON state of the channel region CN of the metal layer 12.

In an embodiment, if there is a voltage difference between the drain region D and the source region S, the channel region CN is turned on so that a large amount of current flows between the drain region D and the source region S. Therefore, data '0' stored in the memory cell can be read in the read operation mode.

On the other hand, in the standby mode, as shown in Table 1, a low voltage is input to the program and read gate 14, a low voltage is input to the metal layer 12, and a low voltage is input to the control gate 10. In this case, a resistance state stored in the metal layer 12 is maintained so that data can be stored in the non-volatile memory device.

In a conventional memory device, cell data deteriorates with the lapse of time, so that there is a limitation on data retention lifetime. Accordingly, bit line (BL) current signals corresponding to cell data '1' and '0' are reduced with the lapse of time.

However, in an embodiment of the present invention, a unit cell is formed using the metal layer 12 having material characteristics similar to those of the ferroelectric layer 13, instead of using the semiconductor substrate. In accordance with an embodiment of the present invention, the ferroelectric layer 13 is formed between two metal electrodes, so that the resulting structure is similar to the capacitor and does not experience cell deterioration. Therefore, an embodiment of the present invention prevents cell data from deteriorating, and can improve data retention characteristics compared to the related art.

Figure 6:
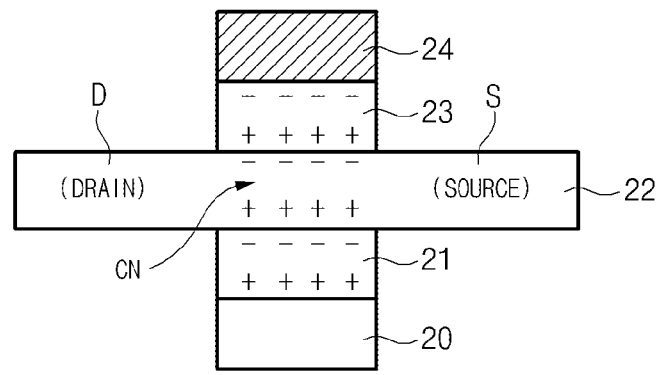
FIG. 6 illustrates a non-volatile memory device according to another embodiment of the present invention.

FIG. 6 is a cross-sectional view illustrating a unit cell of a non-volatile memory device according to another embodiment of the present invention.

Referring to FIG. 6, a program and read gate 20 is formed at the bottom layer, and a ferroelectric layer 21 is formed over the program and read gate 20. A metal layer 22 is formed over the ferroelectric layer 21, and a ferroelectric layer 23 is formed over the metal layer 22. In addition, the program and read gate 24 is formed over the ferroelectric layer 23.

In an embodiment, the upper program and read gate 24 may correspond to the top metal electrode, and the lower program and read gate 20 may correspond to the bottom metal electrode.

The program and read gates (20, 24) and the ferroelectric layers (21, 23) are formed to be parallel in the same direction. In addition, the program and read gates (20, 24) and the ferroelectric layers (21, 23) are formed to cross the metal layer 22.

In addition, the metal layer 22 formed between the program and read gates (20, 24) may be formed of a metal oxide material.

The drain region D and the source region S are formed at ends of the channel region CN of the metal layer 22. In an embodiment, the channel region CN of the metal layer 22 serves as a resistor element. In addition, if the electrode of the metal layer 22 is formed to a thin thickness, the amount of current in the metal layer 22 may be changed according to the electrode thickness of the metal layer 22.

In the metal layer 22, the drain region D, the source region S, and the channel region CN may be formed of the same metal material or different metal materials.

In an embodiment, the metal layer 22 may be formed of Platinum (Pt), Iridium (Ir), or Ruthenium (Ru), etc. If the metal layer 22 is formed of a metal oxide material, the metal layer 22 may include an oxide iridium (IrO2), an oxide strontium ruthenium (SrRuO3), etc.

In addition, the drain region D of the metal layer 22 is coupled to a bit line BL, the source region S is coupled to a sensing line, and the program and read gates (20, 24) may be coupled to a word line (WL).

Figure 7:
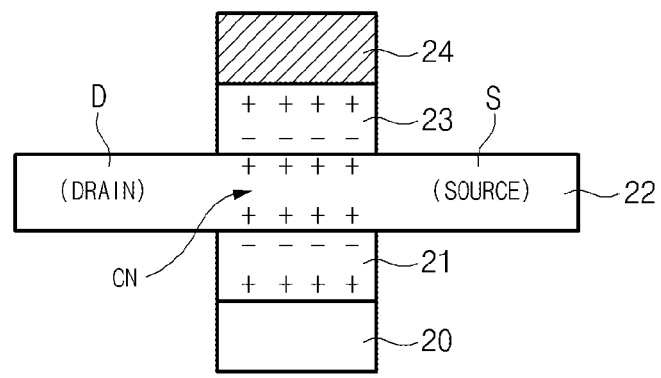
FIGS. 7 to 9 illustrate operation principles of the non-volatile memory device shown in FIG. 6.

FIG. 7 shows operation principles of a non-volatile memory device according to an embodiment of the present invention when data '1' is stored in a unit cell of the non-volatile memory device.

The non-volatile memory device according to an embodiment of the present invention is configured to read/write data using metal-layer channel resistance characteristics that change according to a polarization state of the ferroelectric layers (23, 21).

In a program mode, a read mode, and a standby mode, the voltage levels shown below in Table 2 may be applied to the program and read gates (20, 24) and the metal layer 22.

TABLE 2

| Operation Mode | Program and Read gate (24) | Metal layer (22) | Program and read gate (20) |
|---|---|---|---|
| Program Mode | High (data '0')/ Low (data '1') | High (data '1')/ Low (data '0') | High (data '0')/ Low (data '1') |
| Read Mode | Low | Sensing bias voltage | Low |
| Standby Mode | Low | Low | Low |

As shown in Table 2, in the write operation mode of data '1', a low voltage is input to the program and read gates (20, 24), and a high voltage is input to the drain region D and the source region S of the metal layer 22. A high voltage is input to the source region S.

The high voltage may be a positive (+) voltage, and may be a power-supply voltage (VDD) level equal to or higher than a threshold voltage at which polarization characteristics of the ferroelectric material changes. In contrast, the low voltage may be a ground voltage level lower than the high voltage.

Accordingly, a positive (+) charge is applied to the channel region CN according to the polarity of the ferroelectric layers (21, 23) so that electrons of the channel region CN may enter a depletion state. Therefore, the channel region CN of the metal layer 22 may enter a high-resistance state so that the channel region CN is turned off. The high-resistance state of the channel region CN is defined as a program state of data '1'.

Figure 8:
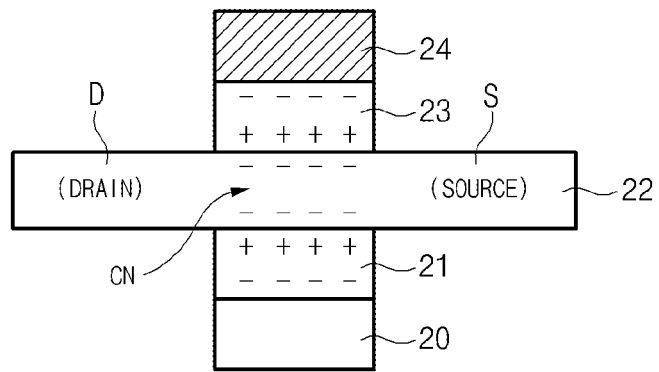

FIG. 8 shows operation principles of a non-volatile memory device according to an embodiment of the present invention when data '0' is stored in a unit cell of the non-volatile memory device.

As shown in Table 2, in the write operation mode of data '0', a high voltage is input to the program and read gates (20, 24), and a low voltage is input to the drain region D and the source region S of the metal layer 22.

A negative (−) charge is applied to the channel region CN according to the polarity of the ferroelectric layers (21, 23) so that electrons are accumulated in the channel region CN. Therefore, the channel region CN of the metal layer 22 may enter a low-resistance state so that the channel region CN is turned on. The low-resistance state of the channel region CN is defined as a program state of data '0'.

The data read operation for use in the non-volatile memory device, according to another embodiment of the present invention, will hereinafter be described with reference to the annexed tables and the accompanying drawings.

In the read operation mode of data, a low voltage is input to the program and read gates (20, 24) as shown in Table 2. A sensing bias voltage is input to the bit line BL coupled to the drain region D, and a ground voltage is input to the sensing line coupled to the source region S. The sensing bias voltage may be provided from a write driver (not shown) as necessary.

In an embodiment, when writing data in the memory cell, the write driver generates a drive voltage in response to write data, and provides the generated drive voltage to the bit line (BL) or the sensing line. The write driver is coupled to each bit line BL or the sensing line.

Thus, a current flowing in the metal layer 22 changes according to the polarity of the ferroelectric layers (21, 23), so that data can be read through the sense amplifier (sense-amp).

That is, if a positive (+) charge is applied to the channel region CN of the metal layer 22, a sensing bias voltage is input to the drain region D, and a ground voltage is input to the source region S, then the metal layer 22 enters a high-resistive state, so that the turn-OFF state of the channel region CN of the metal layer 22 is maintained.

If there is a voltage difference between the drain region D and the source region S, the channel region CN is turned off so that a small amount of current flows between the drain region D and the source region S. Therefore, data '1' stored in the memory cell can be read in the read operation mode.

On the other hand, if a negative (−) charge is applied to the channel region CN of the metal layer 22, a sensing bias voltage is input to the drain region D, and a ground voltage is input to the source region S, then the metal layer 22 enters a low-resistance state, so that the turn-ON state of the channel region CN of the metal layer 22 is maintained.

If there is a voltage difference between the drain region D and the source region S, the channel region CN is turned on so that a large amount of current flows between the drain region D and the source region S. Therefore, data '0' stored in the memory cell can be read in the read operation mode.

On the other hand, in the standby mode, as shown in Table 2, a low voltage is input to the program and read gates (20, 24) and the metal layer 22. In this case, a resistance state stored in the metal layer 22 is maintained so that data can be stored in the non-volatile memory device.

Figure 9:
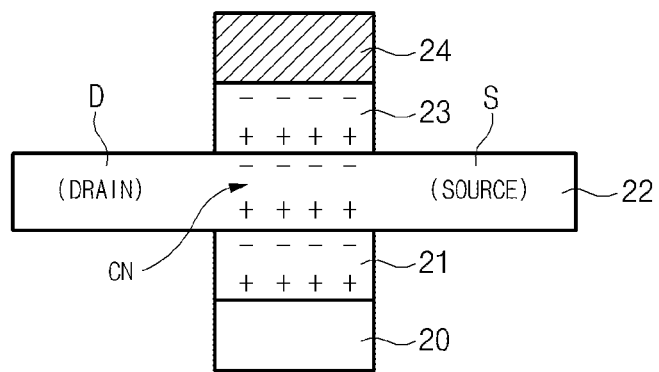

FIG. 9 shows operation principles of a non-volatile memory device according to another embodiment of the present invention when data 'M' is stored in a unit cell of the non-volatile memory device.

In a write operation mode of data 'M', after given data ("0" or "1") is written in the metal layer 22 through one of the ferroelectric layers (21, 23), data opposite to the given data may be stored in the same unit cell through the other ferroelectric layer.

For example, in the write operation mode, after data '0' is stored in the metal layer 22 through one of the ferroelectric layers (21, 23), data '1' is stored in the metal layer 22 through the other ferroelectric layer, so that data 'M', corresponding to an intermediate value of data '0' and data '1', can be finally stored.

First, in the write operation mode of data 'M', a high voltage is input to the read gates (20, 24), and a low voltage is input to the drain region D and the source region S of the metal layer 22.

A negative (−) charge is applied to the channel region CN according to the polarity of the ferroelectric layers (21, 23) so that electrons are accumulated in the channel region CN. Therefore, the channel region CN of the metal layer 22 may enter a low-resistance state so that the channel region CN is turned on. In this way, data '0', indicating the low-resistance state of the channel region CN, can be written.

Thereafter, under the condition that data '0' is written in the metal layer 22, data '1' is stored in a lower part of the metal layer 22.

In other words, a low voltage is input to the lower program and read gate 20, and a high voltage is input to the drain region D and the source region S of the metal layer 22. As a result, a positive (+) charge is applied to the channel region CN according to the polarity of the ferroelectric layer 21 so that electrons of the channel region CN may enter a depletion state. Therefore, the channel region CN of the metal layer 22 may enter a high-resistance state so that the channel region CN is turned off. In this way, data '1', indicating the high-resistance state of the channel region CN, can be written.

As described above, a negative (−) charge is applied to an upper part of the metal layer 22 so that electrons are accumulated therein, and a positive (+) charge is applied to a lower part of the metal layer 22 so that electrons are depleted. Therefore, a resistance value of the channel region CN may correspond to an intermediate value of data '1' and data '0', so that the channel region CN enters an intermediate-resistance state. The intermediate resistance state of the channel region CN is defined as a program state of data 'M'. For example, data 'M' may be defined as data '0.5' corresponding to an intermediate value of data '1' and data '0'.

In accordance with an embodiment of the present invention, in the write operation mode, after the same data '0' is stored in the metal layer 22 through the ferroelectric layers (21, 23), data '1' is stored in the metal layer 22 through the lower ferroelectric layer 23.

However, the scope and spirit of the present invention is not limited thereto. For example, after the same data '1' is stored in the upper and lower parts of the metal layer 22 through the ferroelectric layers (21, 23), data '0' may also be stored in the lower part of the metal layer 22 through the ferroelectric layer 23.

FIGS. 10 to 18 are cross-sectional views illustrating a method for forming a non-volatile memory device according to an embodiment of the present invention. In more detail, FIGS. 10 to 18 are cross-sectional views illustrating a method for forming a unit cell according to an embodiment of the present invention as shown in FIG. 2.

Figure 10:
FIGS. 10 to 18 are cross-sectional views illustrating a method for forming a non-volatile memory device according to still another embodiment of the present invention.

Referring to FIG. 10, a substrate 100 is formed at the bottom layer of the unit cell. In an embodiment, the substrate 100 may be formed of glass, polymer, oxide, or the like. However, the scope and range of the material of the substrate 100 is not limited thereto, and the substrate 100 may also be formed of other materials capable of supporting the unit cell.

Figure 11:
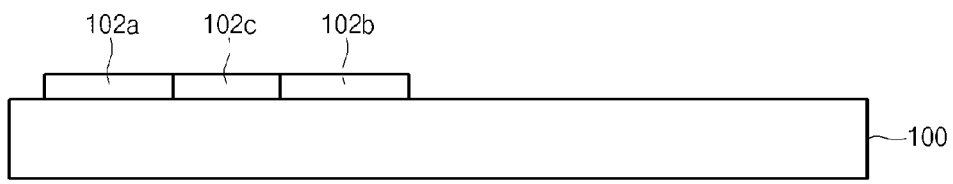

After that, as shown in FIG. 11, a drain region 102a, a source region 102b, and a channel region 102c are formed at one side of an upper part of the substrate 100.

In an embodiment, the drain region 102a, the source region 102b, and the channel region 102c may be formed of a polymer or amorphous thin film. In addition, each of the drain region 102a and the source region 102b may be formed of an N-type region, and the channel region 102c may be formed of a P-type region.

Figure 12:
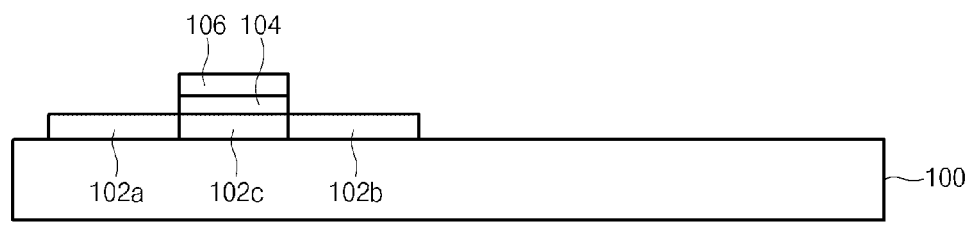

After that, as shown in FIG. 12, an insulation film 104 is formed over the channel region 102c, and the gate 106 may be formed over the insulation film 104, so that a switching element is formed. In an embodiment, the switching element may be formed of a Thin Film Transistor (TFT).

Figure 13:
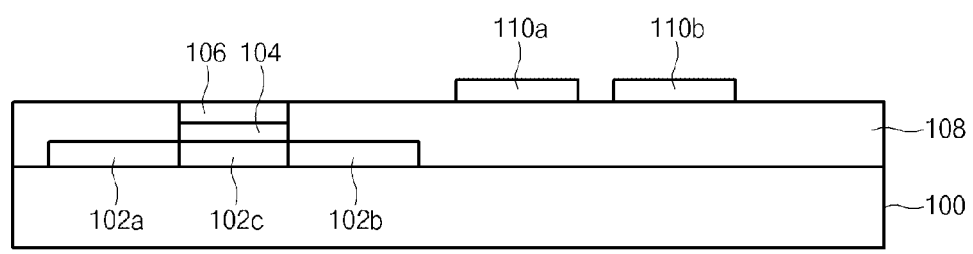

Subsequently, as shown in FIG. 13, an insulation film 108 is formed over the substrate 100, the source region 102b, and the drain region 102a. The control gates 110a and 110b are formed over the insulation film 108, which does not include a switching element. The control gates 110a and 110b may be spaced apart from each other at intervals of a predetermined distance.

Figure 14:
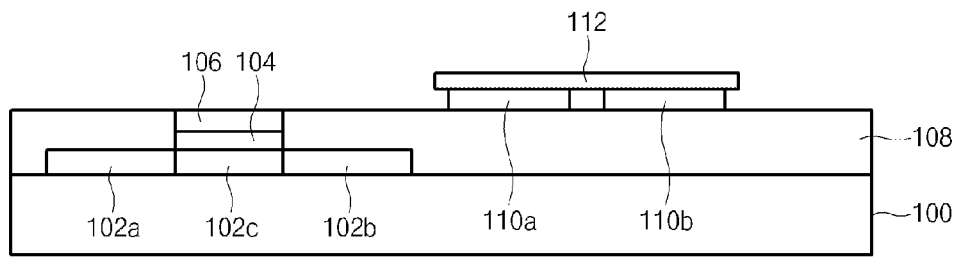

Thereafter, as shown in FIG. 14, the insulation film 112 is formed over the control gates (110a, 110b).

Figure 15:
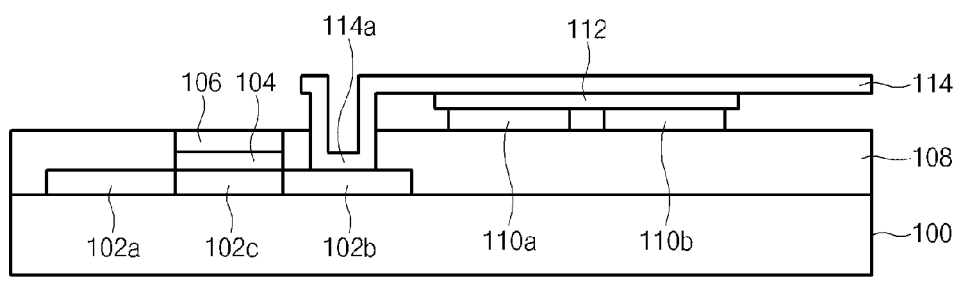

Subsequently, as shown in FIG. 15, a metal layer 114 is formed over the insulation film 112. In the metal layer 114, a trench-shaped connection layer 114a may be coupled to the source region 102b.

In addition, a line-shaped metal layer 114 is formed over the insulation film 108, but not over the drain region 102a, the source region 102b.

Figure 16:
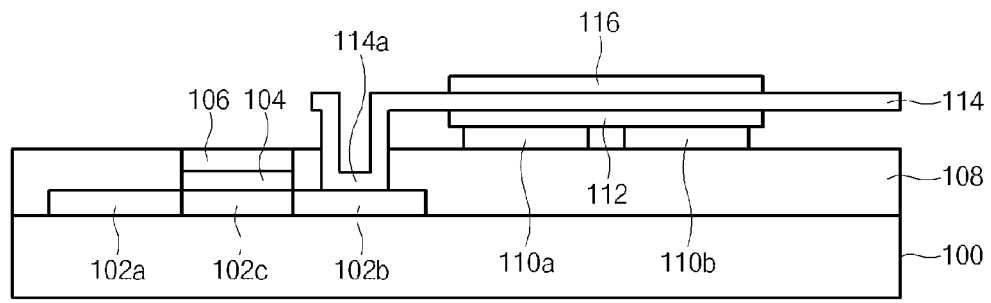
Figure 17:
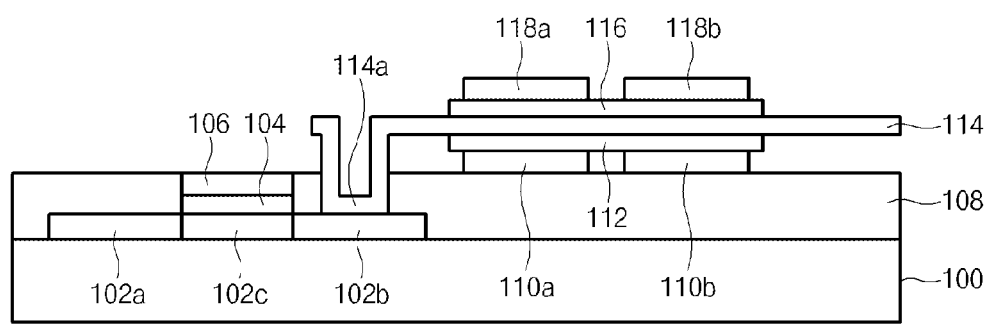

Subsequently, as shown in FIG. 16, the ferroelectric layer 116 is formed over the metal layer 114. As shown in FIG. 17, the program and read gates (118a, 118b) are formed over the ferroelectric layer 116.

In an embodiment, the program and read gates (118a, 118b), the ferroelectric layer 116, and the control gates (110a, 110b) are formed to be parallel and to extend in the same direction. In addition, the program and read gates (118a, 118b) and the metal layer 114 are formed to cross each other.

Figure 18:
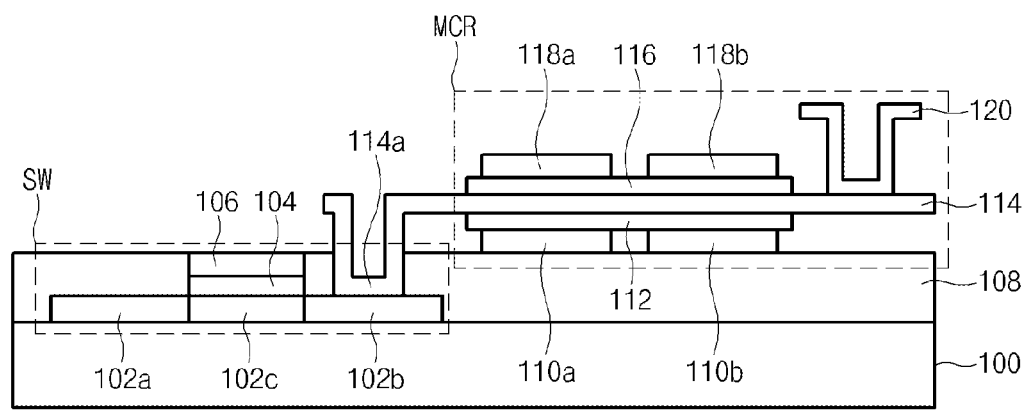

Subsequently, as shown in FIG. 18, a connection layer 120 may be formed over the metal layer 114. In an embodiment, the connection layer 120 may be formed at the same level as the ferroelectric layer 116 and the program and read gates (118a, 118b). A bottom of the connection layer 120 is in contact with the metal layer 114.

As shown in FIG. 18, the transistor in which the drain region 102a, the source region 102b, the channel region 102c, and the gate 106 are formed may correspond to the switching element SW. In addition, the control gates (110a, 110b), the insulation film 112, the metal layer 114, the ferroelectric layer 116, and the program and read gates (118a, 118b) may correspond to a metal channel resistor (MCR). In addition, the connection layer 120, the bottom surface of which is coupled to the metal layer 114, is coupled to the sensing line (SL).

As is apparent from the above description, the above-mentioned exemplary embodiments of the present invention have the following characteristics.

First, an embodiment of the present invention relates to a non-volatile memory device and a method for forming the same, which can implement a ferroelectric memory device using a metal oxide channel layer, resulting in a simplified fabrication process.

Second, an embodiment of the present invention relates to a non-volatile memory device and a method for forming the same, which can adjust a metal electrode, formed of a ferroelectric layer and formed to be thin, resulting in reduction of a cell size.

Third, an embodiment of the present invention relates to a non-volatile memory device and a method for forming the same, which can prevent a memory cell from deteriorating by using a ferroelectric layer as a channel, so that data retention characteristics are improved.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

Also, it is obvious to those skilled in the art that claims that are not explicitly cited in each other in the appended claims may be presented in combination as an exemplary embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A non-volatile memory device comprising:
   a control gate configured to receive a read voltage;
   an insulation film formed over the control gate;
   a metal layer formed over the insulation film, the metal layer configured to include a channel region, and a drain region and a source region formed at first and second ends of the channel region;
   a ferroelectric layer formed over the channel region of the metal layer; and
   a program and read gate formed over the ferroelectric layer,
   wherein a write operation of data corresponding to a resistance state of the channel region is performed by changing polarity of the ferroelectric layer in response to a voltage applied to the program and read gate, the drain and source regions, and the control gate, and
   wherein a read operation of data is performed by sensing a current value changing with a polarity state of the ferroelectric layer if the read voltage is input to the control gate and a sensing bias voltage is input to any of the drain region and the source region.

2. The non-volatile memory device according to claim 1, wherein the control gate, the ferroelectric layer, and the program and read gate are formed to be parallel to each other, and the ferroelectric layer and the metal layer are formed to cross each other.

3. The non-volatile memory device according to claim 1, wherein the metal layer is formed of any of platinum (Pt), iridium (Ir), and ruthenium (Ru).

4. The non-volatile memory device according to claim 1, wherein the metal layer is formed of a metal oxide material.

5. The non-volatile memory device according to claim 1, wherein the metal layer is formed of an oxide iridium ($IrO_2$), an oxide strontium ruthenium ($SrRuO_3$), or a combination thereof.

6. The non-volatile memory device according to claim 1, wherein the insulation film is formed of a silicon oxide film ($SiO2$), a silicon oxide nitride film (SiON) or a combination thereof.

7. The non-volatile memory device according to claim 1, wherein the control gate is formed of a polysilicon or metal material.

8. The non-volatile memory device according to claim 1, wherein, in the write operation, a first voltage lower than a threshold voltage is input to the program and read gate and a second voltage higher than the threshold voltage is input to the drain region and the source region, and
wherein the channel region is in a high-resistance state if the first voltage is input to the control gate, so that data '1' is stored.

9. The non-volatile memory device according to claim 1, wherein, in the write operation, the second voltage is input to the program and read gate and the first voltage is input to the drain region and the source region, and the channel region is in a low-resistance state if the first voltage is input to the control gate, so that data '0' is stored.

10. The non-volatile memory device according to claim 1, wherein, a current between the drain region and the source region is maximized when the channel region is turned on, and a current between the drain region and the source region is minimized when the channel region is turned off, so that any output at a maximized current and a minimized current is the read voltage.

11. The non-volatile memory device according to claim 1, wherein, in the read operation, a ground voltage is input to any of a remaining drain region and a remaining source region.

12. The non-volatile memory device according to claim 1, wherein the read voltage is lower than a threshold value at which polarization characteristics of the ferroelectric layer changes.

13. The non-volatile memory device according to claim 1, wherein the sensing bias voltage is lower than the read voltage.

14. The non-volatile memory device according to claim 1, wherein, in a standby mode, the first voltage is input to the program and read gate, the drain and source regions, and the control gate, respectively.

15. A non-volatile memory device comprising:
a first program and read gate configured to receive a voltage for programming or reading data;
a first ferroelectric layer formed over the first program and read gate;
a metal layer formed over the first ferroelectric layer, the metal layer configured to include a channel region, and a drain region and source region formed at first and second ends of the channel region;
a second ferroelectric layer formed over the channel region of the metal layer; and
a second program and read gate formed over the second ferroelectric layer,
wherein a write operation of data corresponding to a resistance state of the channel region is performed by changing polarities of the first and second ferroelectric layers in response to a voltage applied to the first program and read gate, the second program and read gate, the drain region, and the source region, and
wherein a read operation of data is performed by sensing a current value changing with polarity states of the first and second ferroelectric layers if a sensing bias voltage is input to any of the drain region and the source region.

16. The non-volatile memory device according to claim 15, wherein the first program and read gate, the second program and read gate, the first ferroelectric layer, and the second ferroelectric layer are formed to be parallel to each other, and the first ferroelectric layer and the metal layer are formed to cross each other.

17. The non-volatile memory device according to claim 15, wherein the metal layer is formed of any of platinum (Pt), iridium (Ir), and ruthenium (Ru).

18. The non-volatile memory device according to claim 15, wherein the metal layer is formed of a metal oxide material.

19. The non-volatile memory device according to claim 15, wherein the metal layer is formed of oxide iridium ($IrO_2$), an oxide strontium ruthenium ($SrRuO_3$), or a combination thereof.

20. The non-volatile memory device according to claim 15, wherein, in the write operation, a first voltage lower than a threshold voltage is input to the first program and read gate and the second program and read gate, and
wherein the channel region is in a high-resistance state if a second voltage higher than the threshold voltage is input to the drain region and the source region, so that data '1' is stored.

21. The non-volatile memory device according to claim 15, wherein, in the write operation, the second voltage is input to the first program and read gate and the second program and read gate, and
wherein the channel region is in a low-resistance state if the first voltage is input to the drain region and the source region, so that data '0' is stored.

22. The non-volatile memory device according to claim 15, wherein, in the write operation, if opposite voltages are applied to the first program and read gate and the second program and read gate respectively, the channel region is in a resistance state that is an intermediate-resistance state to data '1' and data '0'.

23. The non-volatile memory device according to claim 22, wherein the write operation includes:
a first write operation in which the same voltage is input to the first program and read gate and the second program and read gate; and
a second write operation in which opposite voltages are input to any of the first program and read gate and the second program and gate, respectively, after execution of the first write operation.

24. The non-volatile memory device according to claim 15, wherein, in the read operation, the first voltage is input to the first program and read gate and the second program and read gate.

25. The non-volatile memory device according to claim 15, wherein, in the read operation, a ground voltage is input to any of a remaining drain region and a remaining source region.

26. The non-volatile memory device according to claim 15, wherein, in a standby mode, a first voltage that is lower than a threshold voltage is input to the first program and read gate, the second program and read gate, the drain region, and the source region, respectively.

27. A method for forming a non-volatile memory device comprising:
forming a transistor over a substrate;

forming a control gate over the substrate;
forming an insulation film over the control gate;
forming a metal layer over the insulation film in such a manner that the metal layer is coupled to a source region of the transistor;
forming a ferroelectric layer over the metal layer; and
forming a gate configured to perform a program and read operation over the ferroelectric layer.

28. The method according to claim 27, wherein the substrate is formed of any of glass, polymer, oxide, and a combination thereof.

29. The method according to claim 27, wherein a channel region, a drain region, and the source region of the transistor are formed of a polymer or an amorphous thin film.

30. The method according to claim 27, wherein the metal layer is formed of any of platinum (Pt), iridium (Ir), ruthenium (Ru), and a combination thereof.

31. The method according to claim 27, wherein the metal layer includes a first curved connection layer that is coupled to the source region of the transistor.

32. The method according to claim 27, the method further comprising:
forming a second curved connection layer over the metal layer in such a manner that the second curved connection layer is adjacent to the ferroelectric layer and the gate.

33. A non-volatile memory device comprising:
a transistor including a first source region and a first drain region, and
a metal channel resistor (MCR) coupled to the first source region of the transistor,
wherein the MCR includes:
a metal channel layer;
a ferroelectric layer coupled to a first side of the metal channel layer;
a program and read gate coupled to the ferroelectric layer; and
a control gate coupled to a second side of the metal channel layer.

34. The non-volatile memory device of claim 33, wherein the program and read gate, the ferroelectric layer, the metal channel layer and the control gate form a field effect transistor (FET).

35. The non-volatile memory device of claim 34, wherein the first source region and the metal channel layer are arranged along a first direction, and
wherein the FET is arranged along a second direction that is perpendicular to the first direction.

36. The non-volatile memory device of claim 33, wherein the MCR is configured to be in a first write mode to write first data ("1") into the MCR when the metal channel layer is configured to turn off, and
wherein the MCR is configured to be in a second write mode to write second data ("0") into the MCR when the metal channel layer is configured to turn on.

* * * * *